(12) United States Patent
Ozard

(10) Patent No.: US 8,743,518 B1
(45) Date of Patent: Jun. 3, 2014

(54) PROTECTION CIRCUIT

(75) Inventor: Kenneth Sean Ozard, Middlesex, NJ (US)

(73) Assignee: Anadigics, Inc., Warren, NJ (US)

( * ) Notice: Subject to any disclaimer, the term of this patent is extended or adjusted under 35 U.S.C. 154(b) by 93 days.

(21) Appl. No.: 13/545,214

(22) Filed: Jul. 10, 2012

Related U.S. Application Data (60) Provisional application No. 61/513,407, filed on Jul. 29, 2011.

(51) Int. Cl.
*H02H 9/04* (2006.01)
*H02H 3/20* (2006.01)
*H03F 1/52* (2006.01)
*H01L 27/02* (2006.01)

(52) U.S. Cl.
CPC ........... *H02H 9/046* (2013.01); *H02H 9/04* (2013.01); *H02H 3/20* (2013.01); *H01L 27/0248* (2013.01); *H01L 27/0255* (2013.01); *H03F 1/52* (2013.01)
USPC .......................................................... 361/56

(58) Field of Classification Search
CPC ........... H02H 9/046; H02H 9/04; H02H 3/20; H01L 27/0248; H01L 27/0255; H03F 1/52
USPC .......................................................... 361/56
See application file for complete search history.

(56) References Cited

U.S. PATENT DOCUMENTS

| | | | | |
|---|---|---|---|---|
| 3,459,941 | A * | 8/1969 | Redzinski et al. | 378/118 |
| 5,852,540 | A * | 12/1998 | Haider | 361/111 |
| 6,577,480 | B1 * | 6/2003 | Avery et al. | 361/56 |
| 2005/0122644 | A1 * | 6/2005 | Ma et al. | 361/56 |
| 2006/0050453 | A1 * | 3/2006 | Duvvury et al. | 361/56 |
| 2012/0293083 | A1 * | 11/2012 | Miskin et al. | 315/192 |

\* cited by examiner

*Primary Examiner* — Scott Bauer
(74) *Attorney, Agent, or Firm* — William L. Botjer (57) ABSTRACT

A protection circuit for electronic circuitry comprising at least three diodes connected in series in such a manner that an anode terminal of a first diode is connected to a cathode terminal of a second diode to form a ring. A first terminal is connected between diodes of a first pair of consecutive diodes of the ring. A second terminal is connected between diodes of a second pair of consecutive diodes of the ring. The position of the first terminal is fixed and position of the second terminal is selectable in such a manner that a pre-determined turn-on voltage of the at least three diodes is obtained.

20 Claims, 5 Drawing Sheets

PROTECTION CIRCUIT

CROSS REFERENCE TO RELATED APPLICATION

This application claims priority from the U.S. provisional application No. 61/513,407, titled "ESD protection circuit", filed on Jul. 29, 2011, the disclosure of which is hereby incorporated by reference.

TECHNICAL FIELD

The present disclosure relates to a protection circuit for various electronic circuits and components thereof. More specifically, the present disclosure relates to a protection circuit that protects the electronic circuits from electrostatic discharge (ESD) and also provides power ruggedness.

BACKGROUND OF THE INVENTION

A protection circuit protects an electronic circuit from damage caused by ESD and impedance mismatches (i.e., power amplifier ruggedness). The electronic circuit is protected from such damage by dissipating positive and negative electrostatic charges through the protection circuit.

The protection circuit is connected between nodes of the electronic circuit being protected. Different configurations of the protection circuit are required to handle different magnitudes of voltages that need to be dissipated from the electronic circuit. It is highly desirable that the protection circuit does not add substantial cost or size to the electronic circuit. It is also highly desirable that the addition of protection circuits to the design does not add substantial time and cost to the circuit design and development process owing to re-designing, re-fabrication, and re-characterization for the different configurations.

SUMMARY OF THE INVENTION

According to embodiments illustrated herein, there is provided a protection circuit comprising at least three diodes connected in series in such a manner that an anode terminal of a first diode is connected to a cathode terminal of a second diode to form a ring. A first terminal is connected between diodes of a first pair of consecutive diodes of the ring. A second terminal is connected between diodes of a second pair of consecutive diodes of the ring. The position of the first terminal is fixed and the position of the second terminal is selectable in such a manner that a pre-determined turn-on voltage of the at least three diodes is obtained.

BRIEF DESCRIPTION OF THE DRAWINGS

Various embodiments of the present disclosure will hereinafter be described in conjunction with the appended drawings provided to illustrate and not to limit the present disclosure, wherein like designations denote like elements, and in which.

DETAILED DESCRIPTION OF THE PREFERRED EMBODIMENTS

Figure 1:
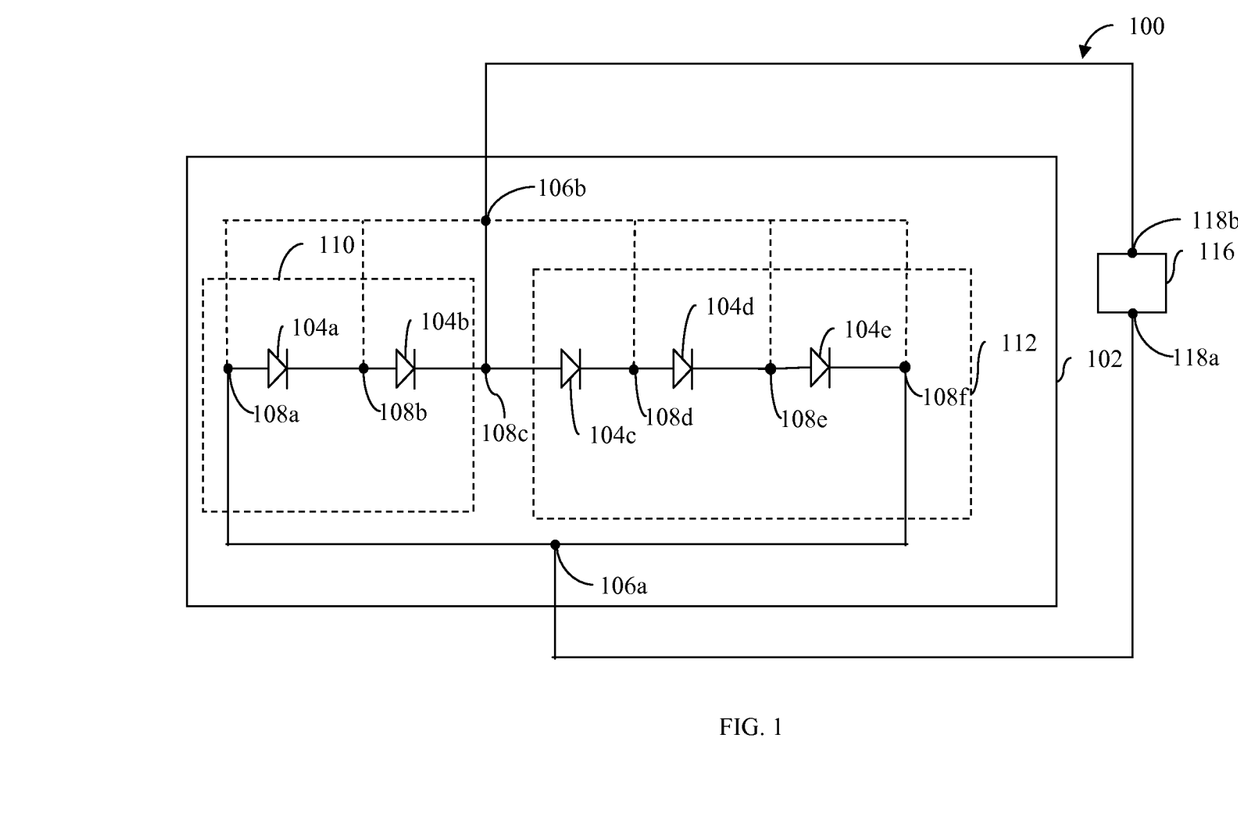
FIG. 1 is a schematic diagram illustrating a protection circuit for protecting an electronic circuit in accordance with at least one embodiment.

FIG. 1 is a schematic diagram 100 illustrating a protection circuit 102 for protecting an electronic circuit 116 in accordance with at least one embodiment. In the embodiment, the protection circuit 102 is configured to protect the electronic circuit 116 from an ESD. In another embodiment, the protection circuit 102 is configured to protect the electronic circuit 116 from high voltages resulting from impedance mismatch at an output terminal (hereafter referred to as second node 118b) of the electronic circuit 116. Examples of the electronic circuit 116 include, but are not limited to, RF power amplifiers, power rectifiers, integrated circuits, DC-to-DC converters, GSM/EDGE power amplifiers, envelope tracking power supply modulators, digital drivers for switching mode power amplifiers, bias circuits, sequencing circuits, detectors, switches, envelope detectors, receivers, low-noise amplifiers, transceivers, and so forth. It should be apparent to a person having ordinary skill in the art that the ongoing description is not limited with respect to the above mentioned examples of the electronic circuit 116. Many other types of electronic circuits can also be protected from ESD and conditions arising from impedance mismatches without departing from the scope of the ongoing description.

In an embodiment, a first node 118a of the electronic circuit 116 is connected to a first terminal 106a of the protection circuit 102. Also, the second node 118b of the electronic circuit 116 is connected to a second terminal 106b of the protection circuit 102.

In another embodiment, the first node 118a of the electronic circuit 116 is coupled with the first terminal 106a of the protection circuit 102. The first node 118a may be at least one of a ground terminal of the electronic circuit 116, a ground ring around the electronic circuit 116, a highly accelerated stress test (HAST) guard ring around the electronic circuit 116, a biased highly accelerated temperatures/humidity stress test (BHAST) guard ring around the electronic circuit 116, or one of the power supply terminals of the electronic circuit 116.

In an embodiment, the second node 118b of the electronic circuit 116 is coupled with the second terminal 106b of the protection circuit 102 via a guard ring (not shown in the FIG. 1). In the embodiment, the guard ring is a metallic ring that is an optional electronic component usually connected to a ground terminal and placed around periphery of the electronic circuit 116. The second node 118b may be at least one of an RF output terminal of the electronic circuit 116, or a bond pad of one of an input and output terminals of the electronic circuit 116.

As shown in FIG. 1, the protection circuit 102 comprises diodes 104a, 104b, 104c, 104d, and 104e (hereinafter referred to as diodes 104). The diodes 104 are connected in series in such a manner that an anode terminal of any diode (e.g., the diode 104a) is connected to a cathode terminal of another (i.e., consecutive) diode (e.g., the diode 104b). Similarly, an anode terminal the diode 104b is connected to a cathode of the diode 104c, an anode terminal of the diode 104c is connected to a cathode of the diode 104d, and an anode terminal of the diode 104d is connected to a cathode of the diode 104e.

Finally, an anode terminal of the diode 104e is connected to a cathode of the diode 104a to form a ring. For the simplicity of explanation, the protection circuit 102 is shown and described further with five diodes. However, it should be apparent to a person having ordinary skill in the art that the ongoing description is not limited with respect to the number of diodes, and the protection circuit 102 can be implemented using at least three diodes.

Between each of the two consecutive diodes in the ring (e.g., 104e and 104a, 104a and 104b, 104b and 104c, and 104c and 104d) respective taps 108a, 108b, 108c, 108d, 108e, and 108f are provided (hereinafter referred to as taps 108). The taps 108 can be moved and reconfigured using a design tool, such as a computer aided design (CAD) layout tool to adjust turn-on voltages of a first circuit 110 and a second circuit 112. It is apparent to a person having ordinary skill in the art that the turn-on voltage corresponds to a voltage required to turn-on forward biased diode(s). The re-configurability or adjustability of the taps 108 allows design, fabrication, testing, and qualification of the protection circuit 102 for different turn-on voltage requirements. The protection circuit 102 can be designed, fabricated, and characterized once, and it can then be quickly reconfigured without re-design, re-fabrication, or re-characterization simply by moving the taps 108 in a design tool (for example, the CAD layout tool). In an embodiment, the taps 108 are implemented in a metal layer in the electronic circuit 116.

In an embodiment, the diodes 104 are base-collector diodes fabricated from epitaxial layers of an Indium Gallium Phosphide (InGaP) Heterojunction Bipolar Transistor (HBT) process. The diodes are optimized in the layout for a higher ratio of periphery-to-area, based on various experimental results. In an embodiment, the diodes 104 can also be constructed from base-emitter or base-collector junctions in bipolar-junction transistor (BJT) or Hetero-junction bipolar transistor (HBT) processes. In alternative embodiments, the diodes 104 can be further constructed from at least one of a Field-Effect Transistor (FET), a Junction Gate Field-Effect Transistor (JFET), an Insulated Gate Bipolar Transistor (IGBT), a Metal-Oxide-Semiconductor Field-Effect Transistor (MOSFET), and a Schottky diode.

The layout, size, and process of the diodes 104 may be varied to achieve higher or lower levels of desired ESD protection offered by the protection circuit 102. The design of the protection circuit 102 can be adjusted with additional or fewer diodes (than depicted in FIG. 1) to raise or lower positive and negative turn-on voltages. In an embodiment, the positive and negative turn-on voltages may be independently varied.

In some embodiments, the protection circuit 102 may be constructed using suitable semiconductor materials, such as Si, GaAs, and other III-V materials.

The first terminal 106a is connected between diodes of a first pair of consecutive diodes of the ring, for example the diode 104e and the diode 104a, using the tap 108a (or 108f). In an embodiment, the position of the first terminal 106a is fixed.

The position of the second terminal 106b is determined based on position of one or more taps of the taps 108. The one or more taps are selected between one or more second pairs of the diodes 104 in such a manner that a pre-determined turn-on voltage of the diodes 104 in the ring is obtained. The position of the second terminal 106b is selectable using the design tool. The protection circuit 102 can be designed, fabricated, and characterized once, and can then be reconfigured for different future applications by the selection of the one or more taps of the taps 108 in a design tool (for example, the CAD layout tool) without any additional time and expense of re-fabrication and re-characterization.

In another embodiment, the first pair of consecutive diodes and the second pair of consecutive diodes are different. Such configuration protects the electronic circuit 116 both from positive and negative polarities of the ESD pulse. This is further explained in detail in FIG. 4.

In an embodiment, zero or near zero (very small) additional layout (interchangeably used as die) area is used to implement the protection circuit 102. In the embodiment, the protection circuit 102 is designed to be an integral part of the bond pad structure of the electronic circuit 116. Such a design saves space, which translates to cost savings as layout cost depends on the amount of layout area consumed.

Figure 2:
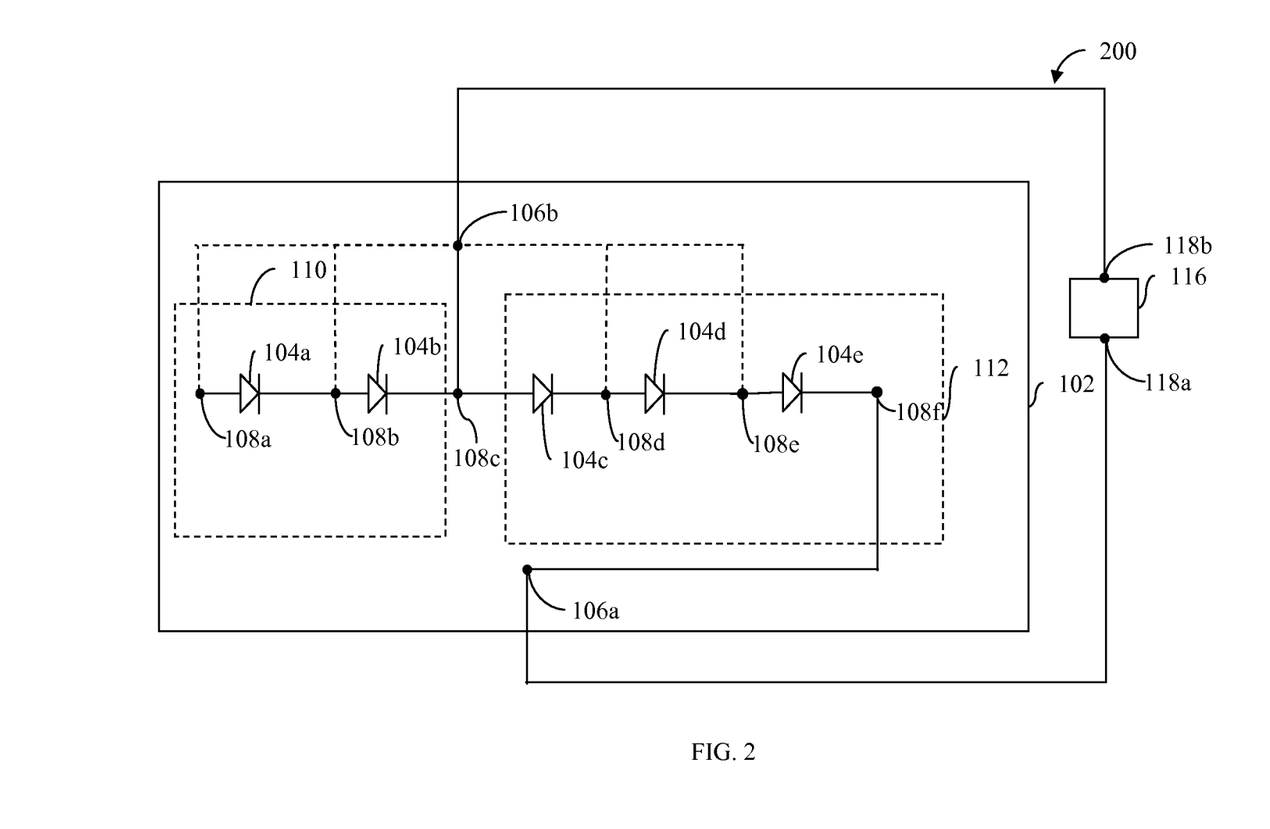
FIG. 2 is a schematic diagram illustrating a protection circuit for protecting an electronic circuit from a positive polarity ESD in accordance with an embodiment.

FIG. 2 is a schematic diagram 200 illustrating the protection circuit 102 for protecting the electronic circuit 116 from a positive polarity ESD in accordance with at least one embodiment of the invention. In an embodiment, a connection from the first terminal 106a to the diode 104a is omitted. Hence, the first terminal 106a is connected to the ring via the diode 104e. Such a configuration is for instances when ESD protection is required for only a positive polarity ESD pulse. In the embodiment, the diodes 104c, 104d and 104e of the diodes 104 turn-on with forward biased voltage applied from the second node 118b to the first node 118a and thus will handle only positive polarity ESDs between the second node 118b and the first node 118a. Consequently, the protection circuit 102 exhibits a positive turn-on voltage of three diodes. As depicted in the FIG. 2, the first terminal 106a can be positioned at any of the taps 108a-108e to set the desired voltage level.

Figure 3:
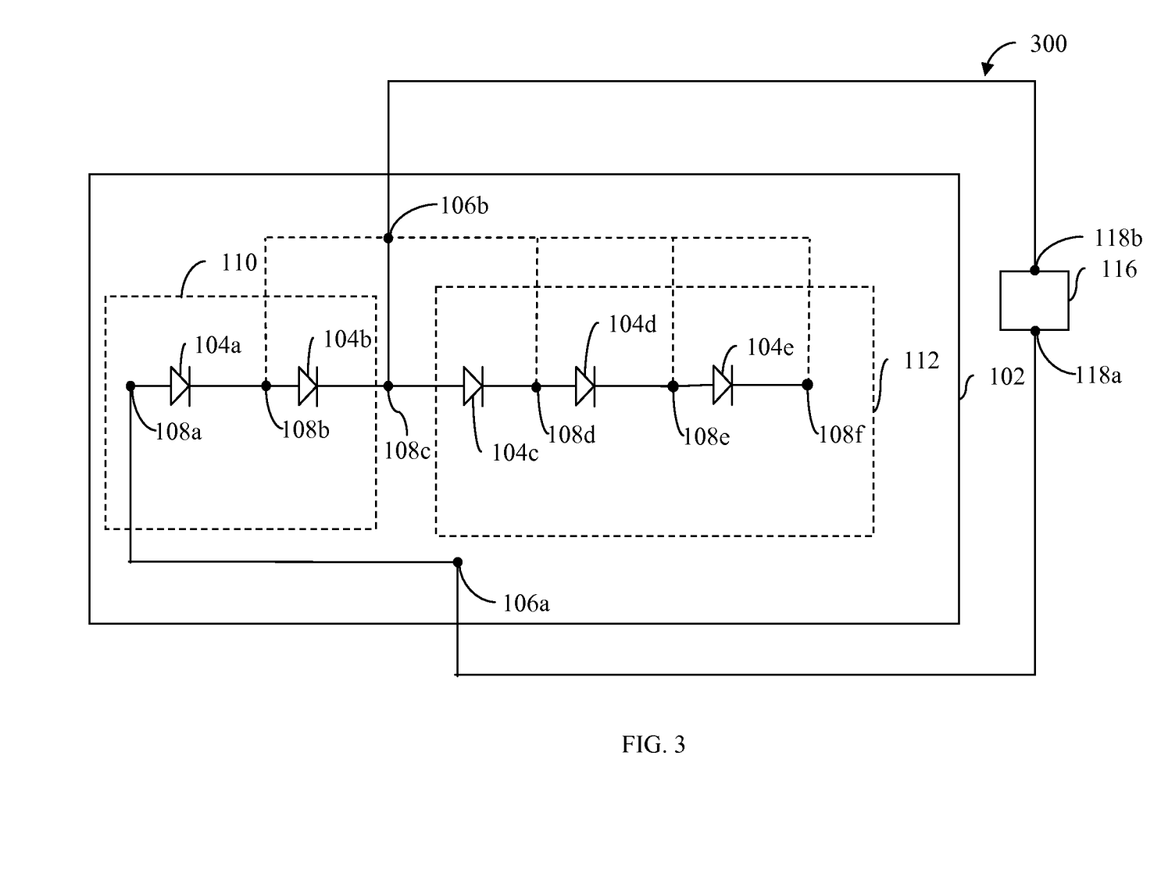
FIG. 3 is a schematic diagram illustrating a protection circuit for protecting an electronic circuit from a negative polarity ESD in accordance with an embodiment.

FIG. 3 is a schematic diagram 300 illustrating the protection circuit 102 for protecting the electronic circuit 116 from a negative polarity ESD in accordance with at least one embodiment of the invention. In an embodiment, a connection from the first terminal 106a to the diode 104e is omitted. Hence, the first terminal 106a is connected to the ring via the diode 104a. Such a configuration is for instances when ESD protection is required for only a negative polarity ESD pulse. In the embodiment, the first circuit 110 of the protection circuit 102 is configured to conduct a negative polarity ESD pulse when the magnitude of a negative voltage at the second node 118b exceeds sum of turn-on voltages of the series of diodes of the first circuit 110. As depicted in the FIG. 3, the first terminal 106a can be positioned at any of the taps 108b-108f to set desired voltage levels.

Figure 4:
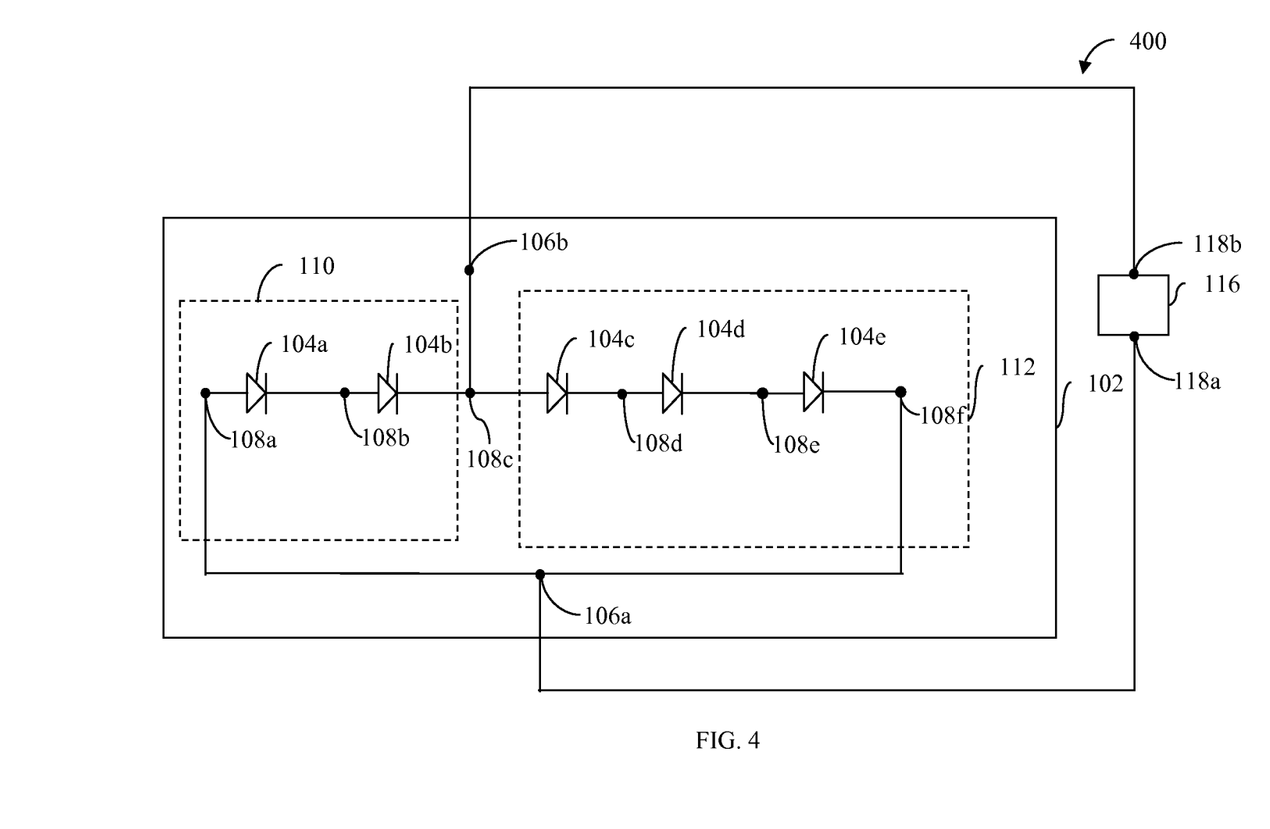
FIG. 4 is a schematic diagram illustrating a protection circuit for protecting an electronic circuit using a single tap in accordance with at least one embodiment.

FIG. 4 is a schematic diagram 400 illustrating the protection circuit 102 for protecting the electronic circuit 116 using a single tap 108c in accordance with at least one embodiment.

In an embodiment, the first terminal 106a and the second terminal 106b divide the ring of diodes 104 in the first circuit 110 and the second circuit 112. The first terminal 106a is connected between diodes of a first pair of consecutive diodes, i.e., the diode 104e and the diode 104a of the ring using the tap 108a (or 108f). The second terminal 106b is connected between diodes of a second pair of consecutive diodes, i.e., the diode 104b and the diode 104c of the ring using the tap 108c. The first pair of consecutive diodes and the second pair of consecutive diodes are different. The first circuit 110 has two diodes (i.e., the diode 104a and the diode 104b) while the second circuit 112 has three diodes (i.e., the diode 104c, the diode 104d, and the diode 104e). Consequently, the first circuit 110 exhibits a negative turn-on voltage of two diodes, and the second circuit 112 exhibits a positive turn-on voltage of three diodes.

In an embodiment, the protection circuit 102 can be configured to improve the ruggedness of the electronic circuit 116, for example an RF power amplifier. In the embodiment, the diode 104c, the diode 104d, and the diode 104e are configured for positive turn-on and the diode 104a and the diode 104b are configured for negative turn-on to improve the ruggedness of the electronic circuit 116. Ruggedness corresponds to the ability of the electronic circuit 116 to survive a mismatch condition on the second node 118b without any damage. In the embodiment, the number of diodes is selected to limit/clamp the peak voltages resulting from the mismatch on the output of the amplifier. This helps keep the output device currents and voltages within the safe operating region (SOA) to prevent device destruction.

In another embodiment, the protection circuit 102 can be configured to protect the electronic circuit from an ESD. The first circuit 110 of the protection circuit 102 is configured to conduct a negative polarity ESD pulse when the magnitude of a negative voltage at the second node 118b exceeds the sum of the turn-on voltages of the series of diodes of the first circuit 110. The second circuit 112 of the protection circuit 102 is configured to conduct a positive polarity ESD pulse when the magnitude of a positive voltage at the second node 118b exceeds a sum of turn-on voltages of the diodes of the second circuit 112.

In FIG. 4, the number of total diodes (hereinafter referred to as ntotal) in the ring is five. The number of diodes in the first circuit 110 (hereinafter referred to as n_first_circuit) is 2 (two) and the number of diodes in the second circuit 112 (hereinafter referred to as n_second_circuit) is 3 (three).

The diodes 104c, 104d, and 104e in the second circuit 112 form a second string of n_second_circuit diodes. The second string of n_second_circuit diodes conducts a positive polarity ESD pulse/voltage from the second terminal 106b to the first terminal 106a when a positive voltage at the second node 118b exceeds a turn-on voltage of $$V_{turn-on\_second\_circuit} = (V_{bc})^* n\_second\_circuit.$$

Where, $V_{bc}$ corresponds to a turn-on voltage of each of the diodes of the diodes 104 in the ring. The turn-on voltage of a diode represents a voltage at which the diode starts conducting current when it is forward-biased.

Thus, when the positive voltage at the second node 118b exceeds a turn-on voltage of $V_{turn-on\_second\_circuit}$, sufficient current flows into the second circuit 112 of the protection circuit 102, such that the second string of diodes, i.e., the diode 104c, the diode 104d, and the diode 104e, turns on, thereby allowing the positive polarity ESD current to flow from the second node 118b through the second circuit 112 to the first node 118a, and thus grounded.

A string of n_first_circuit diodes in the first circuit 110 forms a first string. The first string of diodes, i.e., the diode 104a and the diode 104b, conducts a negative polarity ESD pulse from the first terminal 106a to the second terminal 106b when a negative voltage applied at the second node 118b exceeds a turn-on voltage of $$V_{turn-on\_first\_circuit} = -(V_{bc})^* n\_first\_circuit.$$

Thus, when the negative voltage at the second node 118b exceeds a turn-on voltage of $V_{turn-on\_first\_circuit}$, sufficient current flows into the first circuit 110 of the protection circuit 102, such that the first string of diodes, i.e., the diode 104a and the diode 104b, turns on, thereby allowing the negative polarity ESD current to flow from the second node 118b through the first circuit 110 to the first node 118a and thus grounded.

Multiple embodiments correspond to different layout, number, and size of the diodes 104 in the ring. For example, in an embodiment, For n_second_circuit=1, n_first_circuit=4, $$V_{turn-on\_second\_circuit} = (V_{bc})^* n\_second\_circuit = V_{bc}^* 1,$$
and
$$V_{turn-on\_first\_circuit} = -(V_{bc})^* n\_first\_circuit = -V_{bc}^* 4.$$

In another embodiment, for n_second_circuit=2, n_first_circuit=3, $$V_{turn-on\_second\_circuit} = (V_{bc})^* n\_second\_circuit = V_{bc}^* 2,$$
and
$$V_{turn-on\_first\_circuit} = -(V_{bc})^* n\_first\_circuit = -V_{bc}^* 3.$$

In yet another embodiment, for n_second_circuit=3, n_first_circuit=2, $$V_{turn-on\_second\_circuit} = (V_{bc})^* n\_second\_circuit = V_{bc}^* 3,$$
and
$$V_{turn-on\_first\_circuit} = -(V_{bc})^* n\_first\_circuit = -V_{bc}^* 2.$$

In yet another embodiment, for n_second_circuit=4, n_first_circuit=1, $$V_{turn-on\_second\_circuit} = (V_{bc})^* n\_second\_circuit = V_{bc}^* 4,$$
and
$$V_{turn-on\_first\_circuit} = -(V_{bc})^* n\_first\_circuit = -V_{bc}^* 1.$$

In operation, for example, if the second node 118b needs to be protected from voltages above positive 3.5V and from voltages below negative 2.5V, then the tap 108c is configured for two diodes in the negative direction (approximately $V_{turn-on\_first\_circuit} = -(V_{bc})^* n\_first\_circuit = -1.3V^* 2 = -2.6V$ for certain HBT process typical $V_{bc}$ value), and three diodes in the forward direction (approximately $V_{turn-on\_second\_circuit} = (V_{bc})$ *n_second_circuit=1.3V*3=3.9V for certain HBT process $V_{bc}$).

The position of the second terminal 106b of the protection circuit 102 is set corresponding to the tap 108c. The position of the first terminal 106a is fixed as explained in FIG. 1.

In the schematic diagram 400 as shown in FIG. 4, when a positive voltage differential from the second node 118b of the electronic circuit 116 to the first node 118a exceeds the positive turn-on voltage of the protection circuit 102, the protection circuit 102 prevents the voltages and thus electric fields from rising further by clamping the voltage as a result of the low diode on-resistance and the low metal interconnect resistance. As the magnitude of the positive voltage at the second node 118b exceeds the sum of turn-on voltages of the series connected diodes, i.e., the diode 104c, the diode 104d, and the diode 104e of the second circuit 112 (i.e., $V_{applied}$>3.9V), the second circuit 112 conducts the excess charge and current from the second node 118b to the first node 118a through the second circuit 112.

In the schematic diagram 400 as shown in FIG. 4, when a negative voltage differential from the second node 118b of the electronic circuit 116 to the first node 118a exceeds the negative turn-on voltage of the protection circuit 102, the protection circuit 102 prevents the voltages and thus electric fields from rising further by clamping the voltage as a result of the low diode on-resistance and the low metal interconnect resistance. As the magnitude of the negative voltage at the second node 118b exceeds the sum of turn-on voltages of the series connected diodes, i.e., the diode 104a and the diode 104b of the first circuit 110 (i.e., $V_{applied}$<-2.6V), the first circuit 110 conducts the excess charge and current from the second node 118b to the first node 118a through the first circuit 110.

Thus, the protection circuit 102 protects the electronic circuit 116 from ESD pulses and voltage variations caused due to impedance mismatches in case voltages at the second node 118b exceed $V_{turn\text{-}on\_second\_circuit}$ and/or $V_{turn\text{-}on\_first\_circuit}$.

In some embodiments, a configuration n_second_circuit=0 and n_first_circuit=5 or n_second_circuit=5 and n_first_circuit=0 may also be implemented when a protection from only a single polarity ESD pulse is desired.

It is apparent to a person having ordinary skill in the art that the protection circuit 102 can be modified for different n_second_circuit, n_first_circuit and ntotal. The layout, size, and process of the diodes 104 may also be varied to achieve higher or lower levels of desired ESD protection and/or protection from power amplifier output mismatch (ruggedness).

Figure 5:
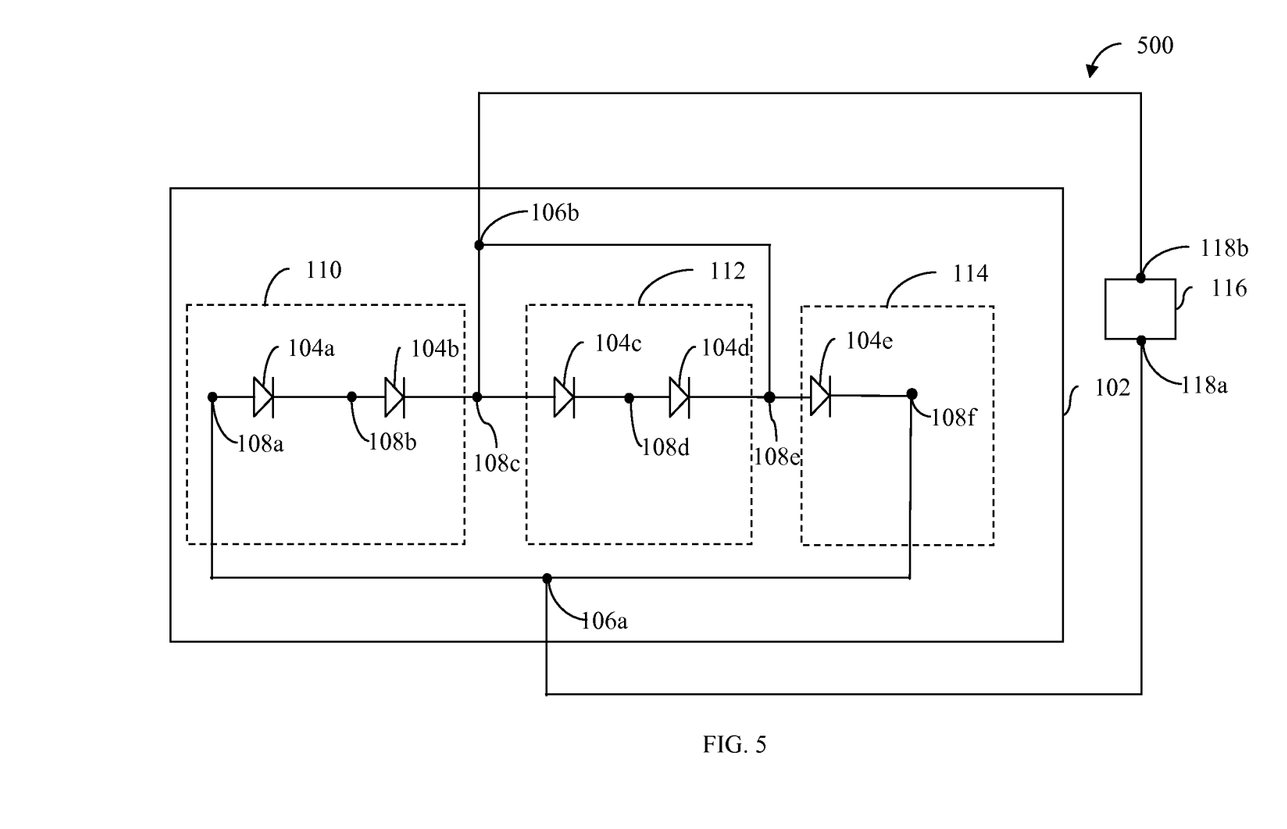
FIG. 5 is a schematic diagram illustrating a protection circuit for protecting an electronic circuit using two taps in accordance with at least one embodiment.

FIG. 5 is a schematic diagram 500 illustrating the protection circuit 102 for protecting the electronic circuit 116 using two taps (i.e., the tap 108c and the tap 108e) in accordance with an embodiment.

In the embodiment, the first terminal 106a and the second terminal 106b divide the ring of diodes 104 in the first circuit 110, the second circuit 112, and a third circuit 114. The first terminal 106a is connected to the tap 108a (the tap 108a is between the diodes 104a and 104e of the ring). The second terminal 106b is connected to two taps, i.e., the tap 108c (between the diode 104b and the diode 104c) and the tap 108e (between the diode 104d and the diode 104e). As a result, the first circuit 110 comprises the diode 104a and the diode 104b, the second circuit 112 comprises the diode 104c and the diode 104d, and the third circuit 114 comprises a single diode, i.e., the diode 104e.

Consequently, the first circuit 110 exhibits a negative turn-on voltage of two diodes and the third circuit 114 exhibits a positive turn-on voltage of only one diode. The second circuit 112 exhibits an inactive state as the second circuit 112 does not conduct any current through the two diodes (104c and 104d).

The layout of the diodes 104 of the ring depends on the frequency and the resulting power, voltage, and current due to the output mismatch/VSWR (voltage standing wave ratio) and the magnitude of the positive and the negative ESD pulses, from which the electronic circuit 116 needs to be protected. For example, if the second node 118b needs to be protected from voltages above positive 1V and from voltages below negative 2.5V, then a first tap is configured for two diodes in the negative direction (approximately $V_{turn\text{-}on\_first\_circuit} = -(V_{bc})*\text{n\_first\_circuit} = -1.3V*2 = -2.6V$ for certain HBT process typical $V_{bc}$ value), and a second tap is configured for one diode in the forward direction (approximately $V_{turn\text{-}on\_second\_circuit} = (V_{bc})*\text{n\_second\_circuit} = 1.3V*1 = 1.3V$ for certain HBT process $V_{bc}$). Therefore, two extra diodes between the tap 108c and the tap 108e have to be in an inactive state to support the requirements. The taps are appropriately configured (i.e. present or not present) using the design tool.

In another embodiment, for example, the ring contains 12 diodes and the second node 118b needs to be protected from voltages above positive 3V and from voltages below negative 6V. In that case, the first tap is configured for five diodes in the negative direction (approximately −6.5V for certain HBT processes typical $V_{bc}$ value), while the second tap is configured for three diodes in the forward direction (approximately +3.9V for certain HBT processes $V_{bc}$). Therefore, four extra diodes between the two taps are in an inactive state to support the requirements.

A person having ordinary skill in the art will appreciate that since one or more diodes between the tap 108c and the tap 108e do not conduct since one or more diodes are not a part of both the first circuit 110 and the third circuit 114. Therefore, the one or more diodes are not included in any of the $V_{turn\text{-}on\_second\_circuit}$ and $V_{turn\text{-}on\_first\_circuit}$ calculations.

In an embodiment, the protection circuit 102 can be configured to improve the ruggedness of the electronic circuit 116, for example an RF power amplifier. In the embodiment, the diode 104c, the diode 104d, and the diode 104e are configured for positive turn-on while two diodes, i.e., the diode 104a and the diode 104b, are configured for negative turn on to improve the ruggedness of the electronic circuit 116.

The method of protection of the electronic circuit 116 from negative and positive polarity ESD pulses and voltage impedance mismatches by the protection circuit 102 in the schematic diagram 500 is readily apparent to a person having ordinary skill in the art, as the schematic diagram 500 works in a manner similar to the schematic diagram 400 (FIG. 4).

A person having ordinary skill in art would appreciate that although FIG. 4 and FIG. 5 have been explained with reference to one and two taps respectively, the present disclosure is not limited to only two taps. In alternative embodiments, more than two taps may also be used without departing from the scope of the ongoing description.

Various embodiments of the present disclosure provide several advantages. The protection circuit 102 is designed to provide adjustable positive and negative turn-on voltages suitable for various applications. The re-configurability or adjustability of the taps allows rapid layout, fabrication, and implementation of the protection circuit for different turn-on voltage requirements without re-designing, re-testing, and re-characterizing. The protection circuit 102 is designed, fabricated, and characterized once. Afterwards, voltages are selected in the design tool by selecting the position of the taps 108. For example, in one implementation (a particular process and total diode chain length), the protection circuit 102 is designed, fabricated, and characterized. Afterwards, whenever the protection circuit 102 is required on future designs, the ESD protection structure layout cell is copied in the CAD layout tool. Appropriate taps are selected based upon the voltages required, thus making the protection circuit 102 re-configurable. Therefore, re-design, re-fabrication, re-testing, and re-characterization of the protection circuit 102 are not required for future designs.

This reduces design and development costs and speeds qualification and time to market. Further, in an embodiment, as the taps are implemented in a metal layer of the electronic circuit to be protected, the overall space (die area) requirement is reduced, resulting in a compact structure of the combination of the protection circuit and the electronic circuit. Further, in the embodiment, as the protection circuit is designed to be an integral part of the bond pad structure of the electronic circuit, the overall die area gets reduced, resulting in cost savings.

The protection circuit 102 is suitable for direct connection to RF power amplifier RF output terminals. The protection circuit 102 achieves very low off-state leakage currents prior to turn-on and very low capacitance. The protection circuit 102 performs with very low parasitic leakage currents and very low parasitic capacitance from the first node 118a with respect to the second node 118b or vice versa. In a typical implementation, direct current impedance in forward biased direction is higher than 40 mega ohms and direct current impedance negative bias direction is higher than 8 mega ohms. Adjustable symmetric or asymmetric turn-on voltages that are handled by the protection circuit 102 can be re-configured, adjusted, and tailored for a particular application.

While various embodiments of the present invention have been illustrated and described, it will be clear that the present invention is not limited to these embodiments. Numerous modifications, changes, variations, substitutions, and equivalents will be apparent to those skilled in the art without departing from the spirit and scope of the invention, as described in the claims that follow.

What is claimed is:

1. A protection circuit comprising:
   at least three diodes connected in series, wherein an anode terminal of a first diode is connected to a cathode terminal of a second diode to form a ring;
   a first terminal connected between diodes of a first pair of consecutive diodes of the ring; and
   a second terminal connected between diodes of a second pair of consecutive diodes of the ring, wherein the position of the first terminal is fixed and the position of the second terminal is selectable in such a manner that a pre-determined turn-on voltage of the at least three diodes is obtained.

2. The protection circuit of claim 1, wherein the position of the second terminal is selectable using a design tool without re-designing, re-fabricating, or re-characterizing the protection circuit.

3. The protection circuit of claim 1, wherein the first pair of consecutive diodes and the second pair of consecutive diodes are the same.

4. The protection circuit of claim 1, wherein the first pair of consecutive diodes and the second pair of consecutive diodes are different.

5. The protection circuit of claim 1, wherein the first terminal and the second terminal divide the ring in a first circuit and a second circuit when the first pair of consecutive diodes and the second pair of consecutive diodes are different, wherein the number of diodes in the first circuit and number of diodes in the second circuit depends on the position of the second terminal.

6. The protection circuit of claim 5, wherein the first terminal is coupled to a first node of an electronic circuit to be protected, the first node being at least one of a ground terminal of the electronic circuit, a ground ring around the electronic circuit, a highly accelerated stress test (NAST) guard ring around the electronic circuit, or a biased highly accelerated stress test (BHAST) guard ring around the electronic circuit.

7. The protection circuit of claim 6, wherein the second terminal is coupled to a second node of the electronic circuit, the second node being at least one of: a RF output terminal of the electronic circuit, or a bond pad of one of an input and output terminals of the electronic circuit.

8. The protection circuit of claim 6, wherein the protection circuit is configured to protect the electronic circuit from an electrostatic discharge (ESD).

9. The protection circuit of claim 6, wherein the first circuit is configured to conduct a negative polarity ESD pulse when a magnitude of a negative voltage at the second node exceeds a sum of turn-on voltages of the series connected diodes of the first circuit.

10. The protection circuit of claim 6, wherein the second circuit is configured to conduct a positive polarity ESD pulse when a magnitude of a positive voltage at the second node exceeds a sum of turn-on voltages of the series connected diodes of the second circuit.

11. The protection circuit of claim 6, wherein the electronic circuit is a radio frequency (RF) power amplifier circuit.

12. The protection circuit of claim 11, wherein the protection circuit is configured to protect the RF power amplifier circuit from high voltages resulting from an impedance mismatch at an output terminal of the RF power amplifier circuit.

13. The protection circuit of claim 6, wherein the first terminal is implemented in a metal layer of the electronic circuit.

14. The protection circuit of claim 1, wherein a diode of the at least three diodes is at least one of a Bipolar Junction Transistor (BJT), a Field-Effect Transistor (FET), a Junction Gate Field-Effect Transistor (JFET), an Insulated Gate Bipolar Transistor (IGBT), a Metal-Oxide-Semiconductor Field-Effect Transistor (MOSFET), and a Schottky diode.

15. A protection circuit for protecting an electronic circuit from Electrostatic Static Discharge (ESD), the protection circuit comprising:
   at least three diodes connected in series, wherein an anode terminal of a first diode is connected to a cathode terminal of a second diode to form a ring;
   a first terminal coupled to a first node of the electronic circuit, wherein the first terminal corresponds to a common terminal between diodes of a first pair of consecutive diodes of the ring; and
   a second terminal coupled to a second node of the electronic circuit, wherein the second terminal corresponds to a common terminal between diodes of a second pair of consecutive diodes, wherein the position of the first terminal is fixed and the position of the second terminal is selectable in such a manner that a pre-determined turn-on voltage of the at least three diodes is obtained.

16. The protection circuit of claim 15, wherein the second pair of diode is selectable using a design tool without re-designing, re-fabricating, or re-characterizing the protection circuit.

17. The protection circuit of claim 15, wherein the electronic circuit is a radio frequency (RF) power amplifier circuit, wherein the protection circuit is configured to protect the RF power amplifier circuit from high voltages resulting from an impedance mismatch at an output terminal of the RF power amplifier circuit.

18. The protection circuit of claim 15, wherein the first terminal and the second terminal divide the ring in a first circuit and a second circuit, wherein the first pair of consecutive diodes and the second pair of consecutive diodes are different.

19. The protection circuit of claim 18, wherein the first circuit is configured to conduct a negative polarity ESD pulse when a magnitude of a negative voltage at the second node exceeds a sum of turn-on voltages of the series connected diodes of the first circuit.

20. The protection circuit of claim 18, wherein the second circuit is configured to conduct a positive polarity ESD pulse when a magnitude of a positive voltage at the second node exceeds a sum of turn-on voltages of the series connected diodes of the second circuit.

* * * * *